(12) United States Patent
Noguchi et al.

(10) Patent No.: US 9,644,994 B2
(45) Date of Patent: May 9, 2017

(54) MAGNETIC SENSOR

(71) Applicant: ALPS ELECTRIC CO., LTD., Tokyo (JP)

(72) Inventors: Takafumi Noguchi, Niigata-ken (JP); Tokuo Nakamura, Niigata-ken (JP); Kazushige Sejimo, Niigata-ken (JP); Eiji Umetsu, Niigata-ken (JP); Hideto Ando, Niigata-ken (JP); Hiroaki Endo, Niigata-ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 127 days.

(21) Appl. No.: 14/592,284

(22) Filed: Jan. 8, 2015

(65) Prior Publication Data

US 2015/0192432 A1     Jul. 9, 2015

(30) Foreign Application Priority Data

Jan. 8, 2014   (JP) ................................ 2014-001714

(51) Int. Cl.
*G01D 5/14* (2006.01)
*G01R 33/09* (2006.01)

(52) U.S. Cl.
CPC ............. *G01D 5/145* (2013.01); *G01R 33/09* (2013.01)

(58) Field of Classification Search
None
See application file for complete search history.

(56) References Cited

U.S. PATENT DOCUMENTS

| 2006/0261802 | A1* | 11/2006 | Oohashi | G06F 3/0338 324/207.21 |
| 2008/0024120 | A1* | 1/2008 | Sasaki | B82Y 25/00 324/207.21 |
| 2010/0259257 | A1* | 10/2010 | Sasaki | B82Y 25/00 324/252 |
| 2012/0200292 | A1 | 8/2012 | Sugihara et al. | |

* cited by examiner

*Primary Examiner* — Melissa Koval
*Assistant Examiner* — Felicia Farrow
(74) *Attorney, Agent, or Firm* — Brinks Gilson & Lione

(57) ABSTRACT

A magnetic sensor for detecting the position of a magnet in an X direction includes two magnetic sensor elements which are disposed to be spaced apart from each other in a Y direction and are disposed to face the magnet in a Z direction, in which a soft magnetic body is provided to be located between the magnet and the two magnetic sensor elements and to be located between the two magnetic sensor elements, the two magnetic sensor elements are provided in a range in which magnetic flux which is generated from the magnet saturates magnetization of free magnetic layers of the two magnetic sensor elements, magnetization directions of fixed magnetic layers of the two magnetic sensor elements are the same as each other, and a bridge circuit is configured with the two magnetic sensor elements.

5 Claims, 15 Drawing Sheets

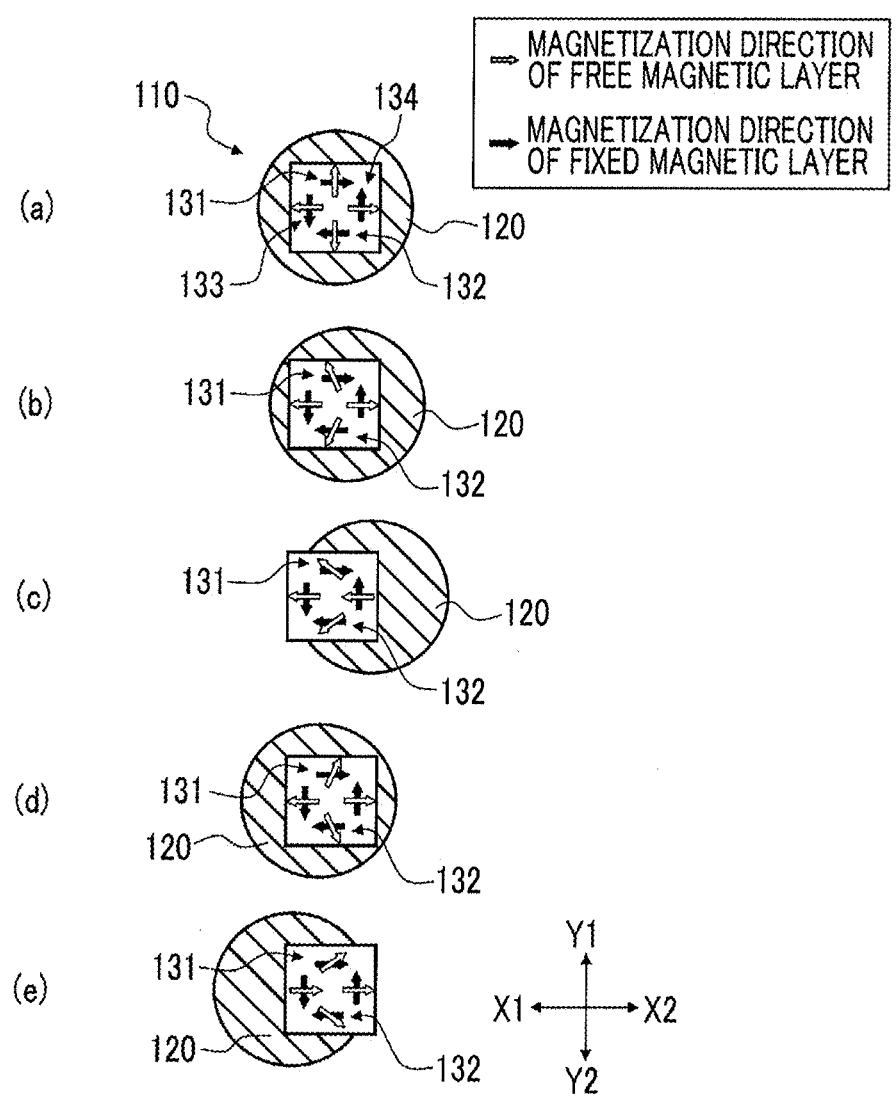

MAGNETIC SENSOR

CLAIM OF PRIORITY

This application claims benefit of priority to Japanese Patent Application No. 2014-001714 filed on Jan. 8, 2014, which is hereby incorporated by reference in its entirety.

BACKGROUND

1. Field of the Disclosure

The present disclosure relates to a magnetic sensor which can detect the position of a magnet by using the magnet and a magnetic sensor element, and in particular, to a magnetic sensor capable of detecting the position in a magnetization direction of a magnet.

2. Description of the Related Art

A magnetic sensor for detecting the position of a magnet is used in a linear actuator, a non-contact switch, or the like. Japanese Unexamined Patent Application Publication No. 2006-276983 discloses a magnetic sensor for a pointing device. FIGS. 15A to 15E are plan views that describe an outline of a detection method with respect to the magnetic sensor according to an example of the related art described in Japanese Unexamined Patent Application Publication No. 2006-276983. As shown in FIGS. 15A to 15E, a magnetic sensor 110 according to an example of the related art has a circular magnet 120 and four giant magnetoresistance effect elements 131 to 134 and detects the position of the magnet 120 which is moved by an operation force from the outside, by the four giant magnetoresistance effect elements 131 to 134.

FIG. 15A shows the magnetic sensor 110 in the initial state. In the initial state, the center of the magnet 120 is provided to overlap with the center of gravity of the four giant magnetoresistance effect elements 131 to 134. As shown in FIGS. 15B and 15C, if the magnet 120 moves in an X2 direction, the direction of a horizontal magnetic field which is applied from the magnet 120 to the first giant magnetoresistance effect element 131 and the second giant magnetoresistance effect element 132 changes. In this way, the magnetization directions of free magnetic layers of the first giant magnetoresistance effect element 131 and the second giant magnetoresistance effect element 132 change so as to follow a horizontal magnetic field direction from the magnet 120. The magnetization direction of the free magnetic layer of the second giant magnetoresistance effect element 132 changes in the direction in which the angle between the magnetization direction of a fixed magnetic layer and the magnetization direction of the free magnetic layer increases in comparison with the initial state. Further, the magnetization direction of the free magnetic layer of the second giant magnetoresistance effect element 132 changes in the direction in which the angle between the magnetization direction of the free magnetic layer and the magnetization direction of the fixed magnetic layer decreases. As a result, the resistance values of the first giant magnetoresistance effect element 131 and the second giant magnetoresistance effect element 132 change and the position of the magnet 120 is detected from the change in resistance value.

As shown in FIGS. 15D and 15E, when the magnet 120 moves in an X1 direction, the magnetization directions of the free magnetic layers of the first giant magnetoresistance effect element 131 and the second giant magnetoresistance effect element 132 change in the direction opposite to the direction shown in FIGS. 15B and 15C. In this way, the resistance values of the first giant magnetoresistance effect element 131 and the second giant magnetoresistance effect element 132 change, and thus the position of the magnet 120 is detected.

Further, Japanese Unexamined Patent Application Publication No. 2003-149312 discloses a Hall element capable of detecting the strength of the magnetic field from a magnet. In a case where a Hall element is used as a magnetic sensor element, which detects the position of a magnet, the position of the magnet can be detected by detecting the strength of a vertical magnetic field orthogonal to the magneto-sensitive surface of the Hall element.

However, in the magnetic sensor 110 according to an example of the related art shown in FIGS. 15A to 15E, the magnet 120 is installed so as to be able to be displaced in not only the X1-X2 direction, but also a Y direction and a Z direction. For this reason, in a case where the magnet 120 has moved in the Y direction, the magnetic field of a component in the Y direction acts on the first giant magnetoresistance effect element 131 and the second giant magnetoresistance effect element 132 which perform position detection in the X direction, and thus the magnetization direction of the free magnetic layer changes. In this way, a detection error of the position in the X direction of the magnet 120 occurs, and thus accurate position detection by the magnetic sensor 110 becomes difficult.

Further, in a case where the Hall element described in Japanese Unexamined Patent Application Publication No. 2003-149312 is used as a magnetic sensor element, the Hall element detects the magnetic field strength of a vertical component with respect to the magneto-sensitive surface. Since magnetic field strength changes in inverse proportion to the square of the distance between a Hall element and a magnet, even in a case where the position in the X direction of the magnet does not change, when the magnet has moved in the Z direction or the Y direction, the distance between the Hall element and the magnet changes, and thus magnetic field strength which is detected by the Hall element changes. The change in magnetic field strength becomes a detection error component of the magnet position in the X direction, and thus accurate position detection in the X direction of the magnet is difficult.

In Japanese Unexamined Patent Application Publication No. 2012-127799, a magnetic sensor is described in which by providing a soft magnetic body which converts an external magnetic field in a Z-axis direction in X and Y directions, it is possible to detect the external magnetic fields of plural axes by a small number of chips. However, the configuration of a magnetic sensor, which detects the position of a magnet and suppresses a detection error is not described therein.

SUMMARY

According to an aspect of the invention, there is provided a magnetic sensor for detecting a position of a magnet in a first direction, including: a magnet magnetized in the first direction; and two magnetic sensor elements, wherein the two magnetic sensor elements are spaced apart from each other in a second direction orthogonal to the first direction and face the magnet in a third direction orthogonal to the first direction and the second direction, a soft magnetic body is located between the magnet and the two magnetic sensor elements in the third direction and located between the two magnetic sensor elements in the second direction, the two magnetic sensor elements each have a fixed magnetic layer in which magnetization is fixed, and a free magnetic layer in which magnetization changes due to an external magnetic field, and are provided in a range in which magnetic flux which is generated from the magnet saturates magnetization of the free magnetic layers of the two magnetic sensor elements, magnetization directions of the fixed magnetic layers of the two magnetic sensor elements are the same as each other, and a bridge circuit is configured with the two magnetic sensor elements.

BRIEF DESCRIPTION OF THE DRAWINGS

FIGS. 15A to 15E are plan views for describing an outline of a detection method of a magnetic sensor of an example of the related art.

DESCRIPTION OF THE EXEMPLARY EMBODIMENTS

Hereinafter, a specific embodiment of a magnetic sensor according to the present invention will be described with reference to the drawings. In addition, the dimensions of the respective drawings are shown to be appropriately changed.

Figure 1A:
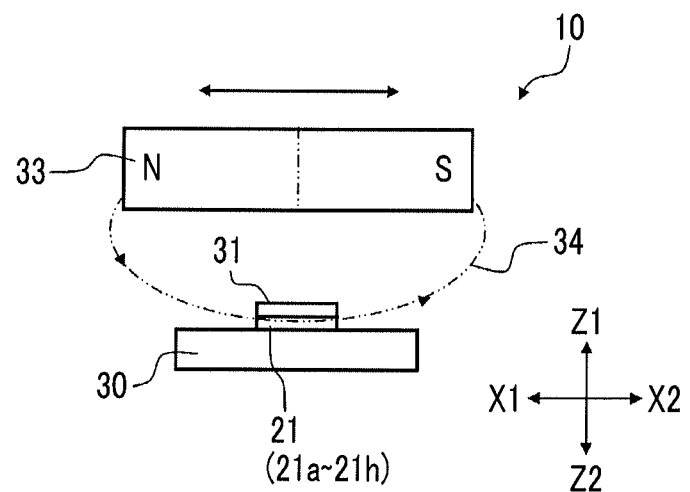
FIGS. 1A and 1B respectively are a side view and a plan view of a magnetic sensor in an embodiment of the present invention.
Figure 1B:
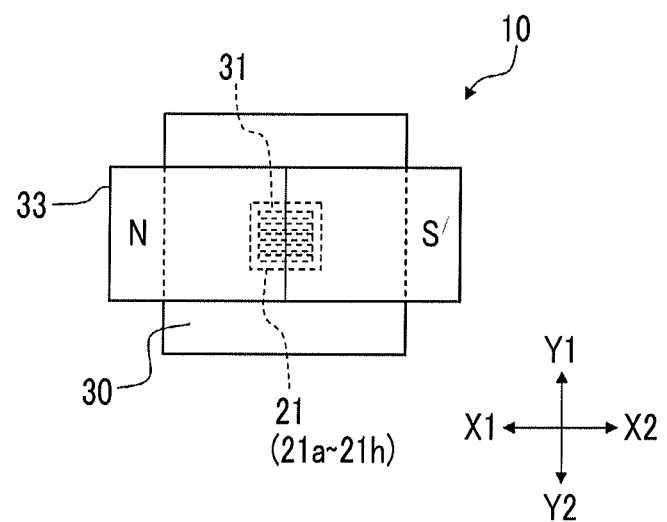

FIG. 1A is a side view of a magnetic sensor 10 in this embodiment, and FIG. 1B is a plan view of the magnetic sensor 10. As shown in FIGS. 1A and 1B, the magnetic sensor 10 has a magnet 33 magnetized in an X1-X2 direction, a magnetic sensor element group 21 composed of a plurality of magnetic sensor elements 21$a$ to 21$h$, and a soft magnetic body 31 provided on the magnetic sensor element group 21. As shown in FIG. 1A, the magnetic sensor element group 21 and the soft magnetic body 31 are formed on a substrate 30, and the magnet 33 and the magnetic sensor element group 21 face each other with a distance therebetween in a Z1-Z2 direction. As shown in FIG. 1B, the magnetic sensor element group 21 composed of the plurality of magnetic sensor elements 21$a$ to 21$h$ is disposed at a position which overlaps with the center of the magnet 33 in a plan view, when viewed from a Z1 direction.

As shown in FIG. 1A, a magnetic field 34 generated from the magnet 33 acts on the magnetic sensor elements 21$a$ to 21$h$, and when the magnet 33 has moved in the X1-X2 direction, the direction and the strength of the magnetic field 34 acting on the magnetic sensor elements 21$a$ to 21$h$ change. In this way, it is possible to detect the position of the magnet 33 in a magnetization direction (the X1-X2 direction). The magnetic sensor 10 of this embodiment is used for detecting the position of the magnet 33 moving in the magnetization direction in, for example, a linear actuator, a non-contact switch, or the like using the magnet 33.

Figure 2:
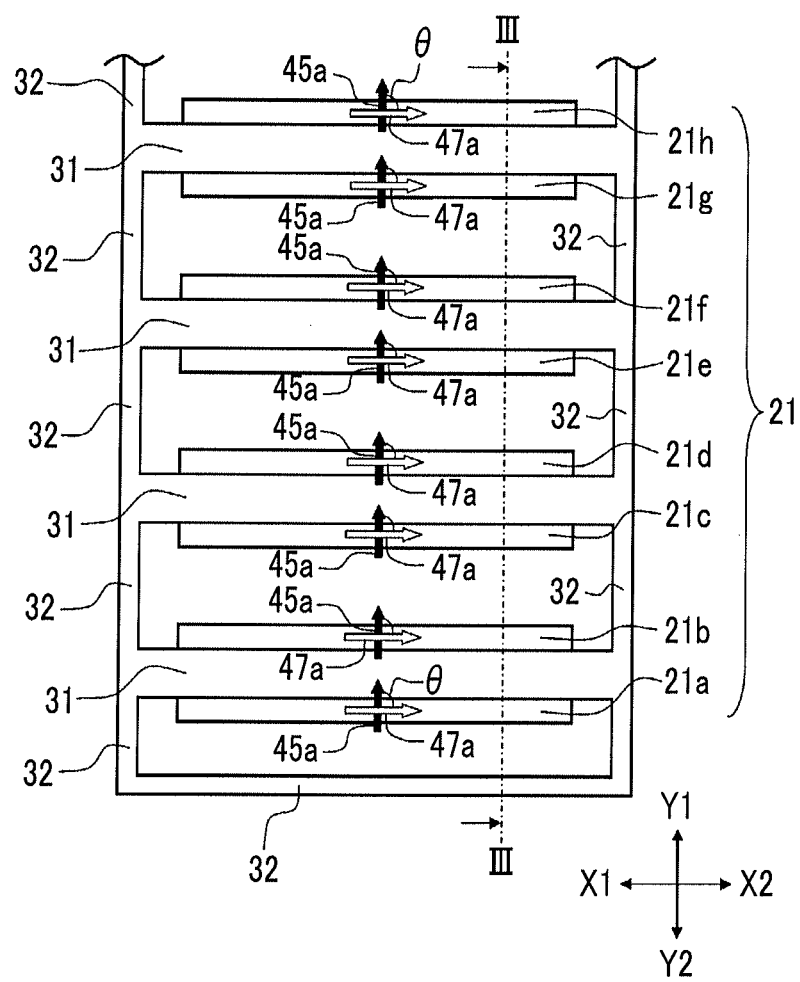
FIG. 2 is a plan view of a magnetic sensor element and a soft magnetic body configuring the magnetic sensor of this embodiment.

FIG. 2 is a plan view of the magnetic sensor element and the soft magnetic body configuring the magnetic sensor of this embodiment. Further, FIG. 3 is a partially enlarged cross-sectional view of the magnetic sensor when cut at the position of line III-III of FIG. 2 and viewed from a direction of an arrow.

As shown in FIG. 2, the plurality of magnetic sensor elements 21$a$ to 21$h$ respectively extend in the X1-X2 direction and are disposed to be spaced from each other in a Y1-Y2 direction. The soft magnetic bodies 31 extend in the X1-X2 direction and are disposed to be spaced from each other in the Y1-Y2 direction, similar to the magnetic sensor elements 21$a$ to 21$h$. A connecting portion 32 is connected to both ends in the X1-X2 direction of each of the soft magnetic bodies 31 disposed in the Y1-Y2 direction, and thus the connecting portion 32 connects the plurality of soft magnetic bodies 31 in the Y1-Y2 direction. In this embodiment, the soft magnetic body 31 and the connecting portion 32 are integrally formed by using the same material.

As shown in FIG. 2, the soft magnetic bodies 31 are respectively provided between two magnetic sensor elements 21$a$ and 21$b$, between two magnetic sensor elements 21$c$ and 21$d$, between two magnetic sensor elements 21$e$ and 21$f$, and between two magnetic sensor elements 21$g$ and 21$h$ in the Y1-Y2 direction.

Figure 3:
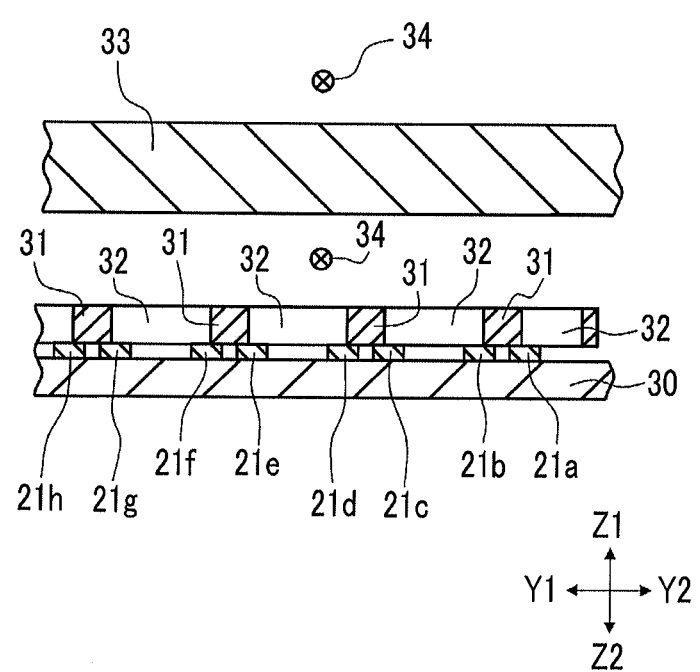
FIG. 3 is a partially enlarged cross-sectional view of the magnetic sensor when cut at the position of line III-III of FIG. 2 and viewed from a direction of an arrow.

As shown in FIG. 3, the plurality of magnetic sensor elements 21$a$ to 21$h$ are provided on the substrate 30, the soft magnetic bodies 31 and the connecting portion 32 are provided on the magnetic sensor elements 21$a$ to 21$h$, and the soft magnetic body 31 is disposed to overlap with a portion of each of the magnetic sensor elements 21a to 21h. Further, the soft magnetic bodies 31 are disposed between the magnet 33 and the magnetic sensor elements 21a to 21h in the Z1-Z2 direction, and the magnetic sensor elements 21a to 21h and the soft magnetic bodies 31 are disposed to be spaced apart from the magnet 33 in the Z2 direction.

In this embodiment, the soft magnetic body 31 and the connecting portion 32 are formed of a soft magnetic material in which at least one material selected from soft magnetic materials such as NiFe, CoFe, CoFeSiB, CoZrTi, and CoZrNb is included.

Figure 4:
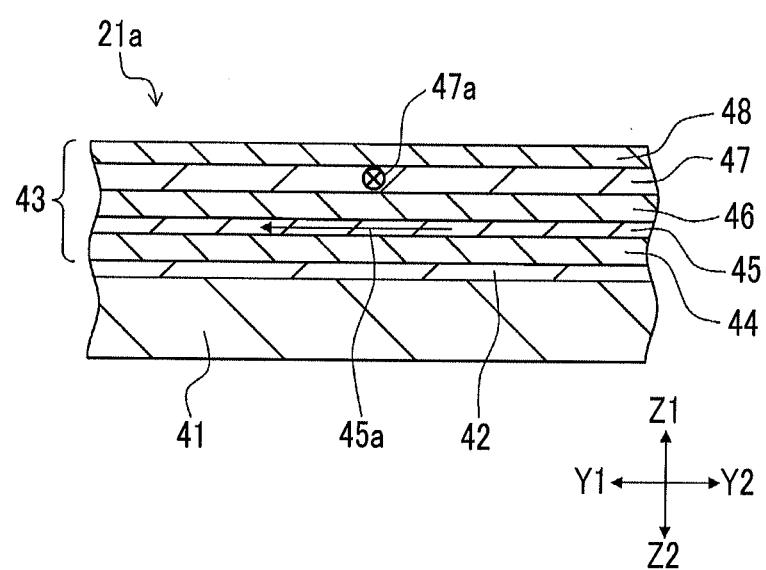
FIG. 4 is a partially enlarged cross-sectional view of the magnetic sensor element when cut along line III-III of FIG. 2 and viewed from a direction of an arrow.

FIG. 4 is a partially enlarged cross-sectional view of the magnetic sensor element when cut along line III-III of FIG. 2 and viewed from a direction of an arrow. In this embodiment, as each of the magnetic sensor elements 21a to 21h, a giant magneto resistance (GMR) element is used. As shown in FIG. 4, with respect to one magnetic sensor element (for example, the magnetic sensor element 21a) among the plurality of magnetic sensor elements 21a to 21h, a laminated structure of a magnetoresistance effect film 43 configuring the magnetic sensor element 21a is shown. The magnetoresistance effect film 43 is formed on the upper surface of a silicon substrate 41 with an insulating film 42 interposed therebetween. As shown in FIG. 4, the magnetoresistance effect film 43 is configured by laminating an antiferromagnetic layer 44, a fixed magnetic layer 45, a nonmagnetic layer 46, and a free magnetic layer 47 in this order and covering the surface of the free magnetic layer 47 with a protective layer 48.

In the magnetoresistance effect film 43, a magnetization direction 45a of the fixed magnetic layer 45 is fixed due to the switched connection of the antiferromagnetic layer 44 and the fixed magnetic layer 45. As shown in FIG. 4, the magnetization direction 45a is directed in the Y1 direction in a state of being parallel to the silicon substrate 41. Further, a magnetization direction 47a of the free magnetic layer 47 changes due to a magnetic field applied from the outside. In addition, in the following description, the "magnetization direction 45a of the fixed magnetic layer 45" is referred to as a "fixed magnetization direction 45a". Further, the "magnetization direction 47a of the free magnetic layer 47" is referred to as a "free magnetization direction 47a". This GMR element is configured with a film, as shown in FIG. 4, and senses a magnetic field component in a plane of the film.

In this embodiment, the insulating film 42 may be a silicon oxide film obtained by thermally oxidizing the silicon substrate 41, an alumina film formed by a sputtering method or the like, an oxide film, or the like. The antiferromagnetic layer 44 is formed of an antiferromagnetic material such as an Ir—Mn alloy (an iridium-manganese alloy). The fixed magnetic layer 45 is formed of a soft magnetic material such as a Co—Fe alloy (a cobalt-iron alloy), or the like. The nonmagnetic layer 46 is Cu (copper) or the like. The free magnetic layer 47 is formed of a soft magnetic material such as a Ni—Fe alloy (a nickel-iron alloy) having a small coercive force and large magnetic permeability. The protective layer 48 is a layer of Ta (tantalum) or the like. In addition, the laminated structure of the magnetoresistance effect film 43 shown in FIG. 4 and the materials which are used therein are examples and other laminated structures are also acceptable.

Figure 5:
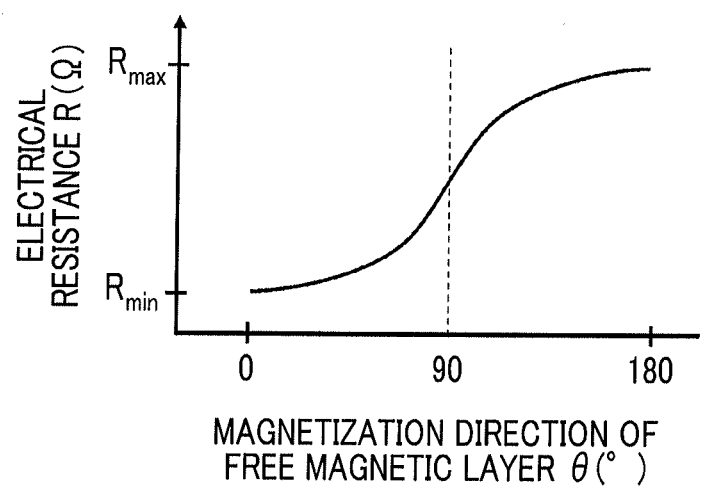
FIG. 5 is a graph for describing the relationship between a magnetization direction of a free magnetic layer and the electrical resistance of the magnetic sensor element.

FIG. 5 is a schematic graph for describing the relationship between the magnetization direction of the free magnetic layer and the electrical resistance of the magnetic sensor element. Further, in FIG. 2, each of the fixed magnetization direction 45a and the free magnetization direction 47a of each of the magnetic sensor elements 21a to 21h is shown by an arrow. As shown in FIG. 2, all of the fixed magnetization directions 45a of the magnetic sensor elements 21a to 21h are fixed in the Y1 direction and directed in the same direction. Further, the free magnetization direction 47a changes due to a magnetic field applied from the outside. For example, in a state where the magnet 33 or the like is not disposed and an external magnetic field is not applied, the free magnetization direction 47a is directed in the X1-X2 direction due to the shape anisotropy of each of the magnetic sensor elements 21a to 21h, and the fixed magnetization direction 45a and the free magnetization direction 47a are orthogonal to each other.

As shown in FIG. 2, the angle between the free magnetization direction 47a and the fixed magnetization direction 45a is set to be θ. FIG. 5 is a schematic graph in which the angle θ when the free magnetization direction 47a changes due to application of the magnetic field 34 which is generated from the magnet 33 is shown on the horizontal axis and the electrical resistance value of each of the magnetic sensor elements 21a to 21h is shown on the vertical axis. If the magnetic field 34, which is generated from the magnet 33, is applied to the magnetic sensor elements 21a to 21h, and thus the free magnetization direction 47a approaches being parallel to the fixed magnetization direction 45a, the angle θ becomes smaller and electrical resistance is reduced. In contrast, if the free magnetization direction 47a approaches being anti-parallel to the fixed magnetization direction 45a, the angle θ becomes larger and an electrical resistance value increases. The position in the X1-X2 direction of the magnet 33 can be detected by the resistance change.

Further, in this embodiment, the residual magnetic flux density of the magnet 33 is set sufficiently large so as to saturate the magnetization of the free magnetic layers 47 of the magnetic sensor elements 21a to 21h. That is, the free magnetization direction 47a changes depending on only the direction of the magnetic field 34 of the magnet 33 without depending on the magnetic field strength of the magnet 33. For this reason, in this embodiment, as the magnet 33, a magnet having a large residual magnetic flux density, such as a neodymium magnet, a samarium cobalt magnet, an alnico magnet, a ferrite magnet, or a plastic magnet, is suitable. Then, a magnet having a residual magnetic flux density in a range of 100 mT to 1500 mT is selected.

Figure 6A:
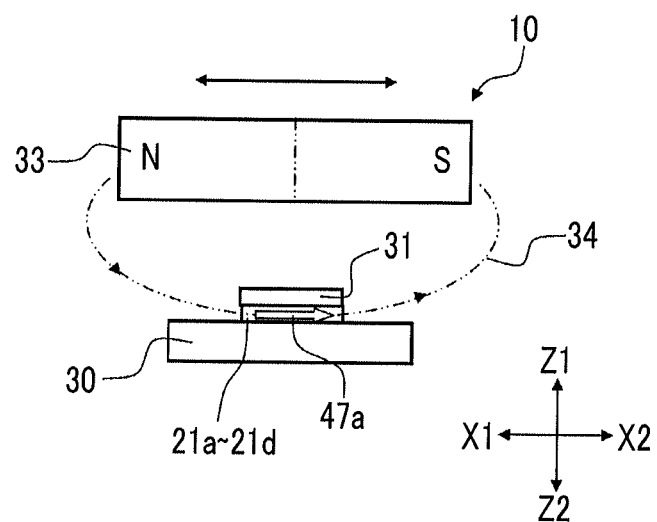
FIGS. 6A and 6B respectively are a side view showing the relationship between a magnetic field which is generated from a magnet and a magnetization direction of the free magnetic layer of the magnetic sensor element, and a plan view of the magnetic sensor element and the soft magnetic body showing the relationship between a magnetic field which is generated from a magnet and a magnetization direction of the free magnetic layer of the magnetic sensor element.
Figure 6B:
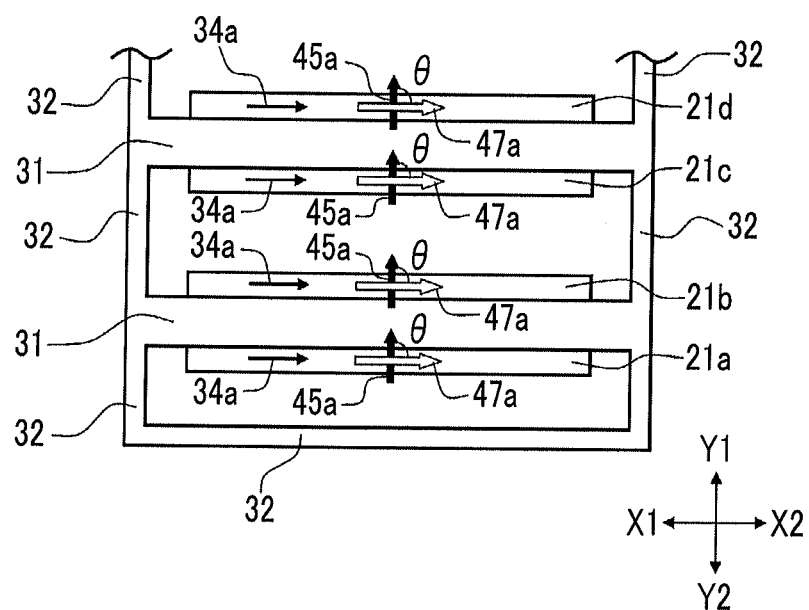

FIGS. 6A and 6B respectively are a side view showing the relationship between a magnetic field which is generated from the magnet and the magnetization direction of the free magnetic layer of the magnetic sensor element, and a plan view of the magnetic sensor element and the soft magnetic body showing the relationship between a magnetic field which is generated from the magnet and the magnetization direction of the free magnetic layer of the magnetic sensor element. The magnetic sensor 10 shown in FIGS. 1 to 3 is configured to have the magnetic sensor element group 21 (the magnetic sensor elements 21a to 21h). However, position detection of the magnet 33 is possible with only at least two magnetic sensor elements (for example, the magnetic sensor elements 21a and 21b). FIGS. 6A and 6B show a method of detecting the position of the magnet 33 by using the four magnetic sensor elements 21a to 21d.

FIGS. 6A and 6B show a case where the magnetic sensor elements 21a to 21d are located at the center in the X1-X2 direction of the magnet 33. As shown in FIG. 6A, the magnetic field 34, which is generated from the magnet 33, passes through the magnetic sensor elements 21a to 21d in an elliptical locus from the N-pole to the S-pole. Since the magnetic sensor elements 21a to 21d are located at the center in the X1-X2 direction of the magnet 33, the magnetic field 34 acting on the magnetic sensor elements 21a to 21d is only an x-component 34a, and a magnetic field component in the Y1-Y2 direction and a magnetic field component in the Z1-Z2 direction do not act on the magnetic sensor elements 21a to 21d.

As shown in FIG. 6B, all of the fixed magnetization directions 45a of the magnetic sensor elements 21a to 21d are directed in the Y1 direction, and all of the free magnetization directions 47a of the magnetic sensor elements 21a to 21d are directed in the X2 direction along the direction of the x-component 34a of the magnetic field 34 from the magnet 33. That is, the free magnetization direction 47a is directed in a direction orthogonal to the fixed magnetization direction 45a. Therefore, the angle between the respective fixed magnetization direction 45a and the respective free magnetization direction 47a of each of the magnetic sensor elements 21a to 21d is the same and a resistance value becomes approximately the same value.

Figure 7:
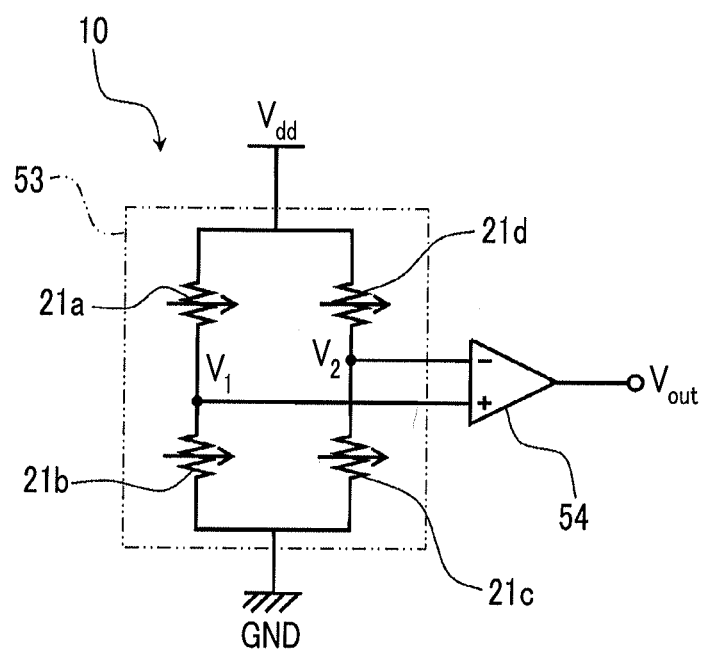
FIG. 7 is a full-bridge circuit, which is configured with four magnetic sensor elements.

FIG. 7 is a full-bridge circuit configured with the magnetic sensor elements. As shown in FIG. 7, the magnetic sensor element 21a and the magnetic sensor element 21b connected in series and the magnetic sensor element 21c and the magnetic sensor element 21d connected in series are connected in parallel between an input terminal ($V_{dd}$) and a ground terminal (GND), thereby configuring a full-bridge circuit 53. A midpoint voltage ($V_1$) is extracted from between the magnetic sensor element 21a and the magnetic sensor element 21b connected in series and a midpoint voltage ($V_2$) is extracted from between the magnetic sensor element 21c and the magnetic sensor element 21d. A difference ($V_1-V_2$) between the midpoint voltage ($V_1$) and the midpoint voltage ($V_2$) is amplified by a differential amplifier 54 and output as an output voltage ($V_{out}$).

If a case where the magnetic sensor elements 21a to 21d are located at the center in the X1-X2 direction of the magnet 33, shown in FIGS. 6A and 6B, is set to be the initial state, since the resistance values of the magnetic sensor elements 21a to 21d in the initial state are approximately the same, the midpoint voltage ($V_1$) and the midpoint voltage ($V_2$) shown in FIG. 7 become the same value, and thus the difference ($V_1-V_2$) is 0 V.

Figure 8A:
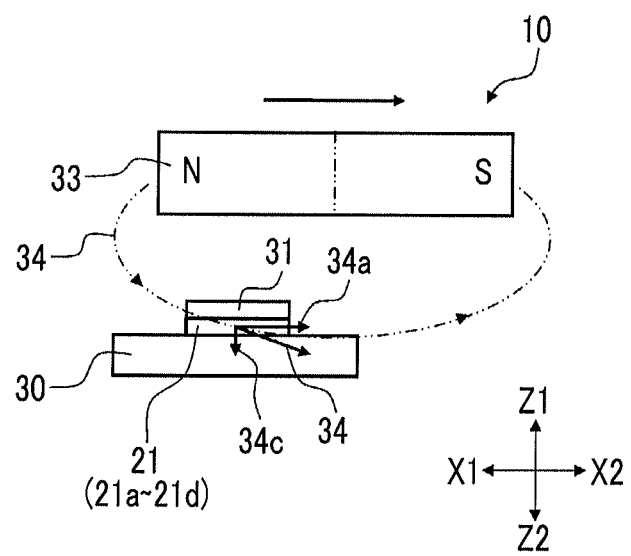
FIGS. 8A and 8B respectively are a side view and a partially enlarged cross-sectional view for describing a position detecting method when the magnet has moved in an X direction.
Figure 8B:
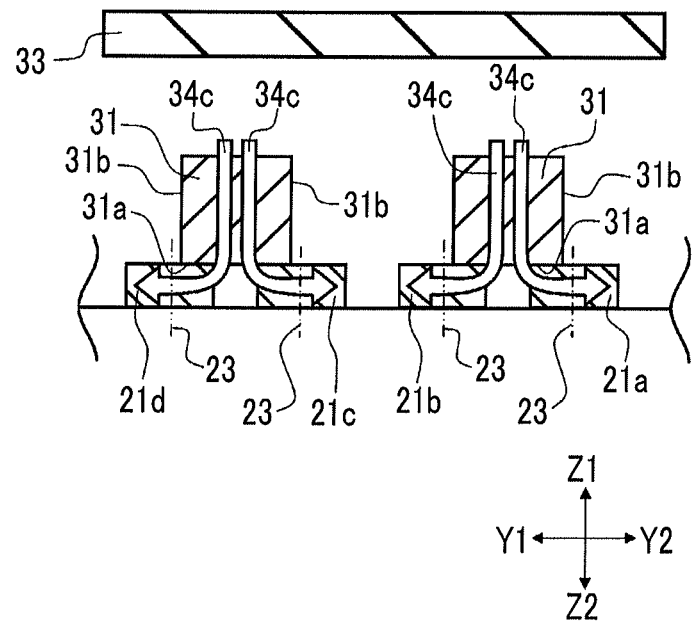
Figure 9:
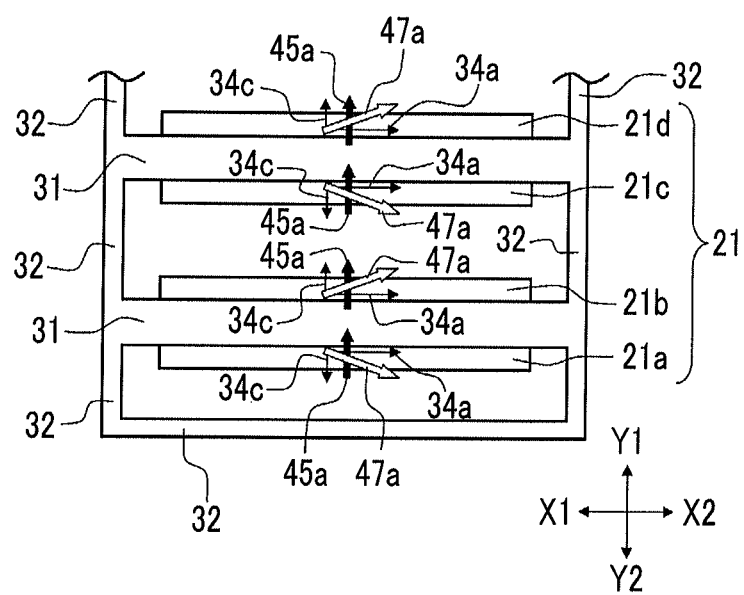
FIG. 9 is a plan view of the magnetic sensor element and the soft magnetic body for describing the position detecting method when the magnet has moved in the X direction.

FIGS. 8A and 8B are schematic diagrams for describing a position detecting method when the magnet has moved in the X direction, wherein FIG. 8A is a side view and FIG. 8B is a partially enlarged cross-sectional view. Further, FIG. 9 is a plan view of the magnetic sensor element and the soft magnetic body for describing the position detecting method when the magnet has moved in the X direction.

As shown in FIG. 8A, in a case where the magnet 33 has moved parallel to the X2 direction, the magnetic field 34 which is generated from the magnet 33 passes through the magnetic sensor elements 21a to 21d in an oblique direction. Therefore, in addition to the x-component 34a of the magnetic field 34, a z-component 34c of the magnetic field 34 acts on the magnetic sensor elements 21a to 21d and the soft magnetic bodies 31. Further, in FIGS. 8A, 8B, and 9, the magnetic sensor element group 21 which includes the magnetic sensor elements 21a to 21d is disposed to be located at the center in the Y1-Y2 direction of the magnet 33. For this reason, even if the magnet 33 moves in the X2 direction, a y-component 34b (not shown in FIGS. 8A, 8B, and 9) of the magnetic field 34 which is generated from the magnet 33 does not act on the magnetic sensor elements 21a to 21d.

As shown in FIG. 8B, with respect to the two magnetic sensor elements 21a and 21b, the soft magnetic body 31 is provided between the two magnetic sensor elements 21a and 21b and the magnet 33 in the Z1-Z2 direction. Further, the soft magnetic body 31 is provided between the two magnetic sensor elements 21a and 21b in the Y1-Y2 direction and an end portion 31a which is located on the sides of the two magnetic sensor elements 21a and 21b is disposed to overlap with a portion of each of the two magnetic sensor elements 21a and 21b. Also, with respect to the two magnetic sensor elements 21c and 21d, the soft magnetic body 31 is provided in the same manner.

In this way, a magnetic path bent from the Z1-Z2 direction to the Y2 direction is formed by the soft magnetic body 31 and the magnetic sensor element 21a, and a magnetic path bent from the Z1-Z2 direction to the Y1 direction is formed by the soft magnetic body 31 and the magnetic sensor element 21b. Therefore, the magnetic flux of the z-component 34c of the magnetic field 34 is converged to the soft magnetic body 31 and flows out to the end portion 31a on the sides of the magnetic sensor elements 21a and 21b, of the soft magnetic body 31. Then, the magnetic flux of the z-component 34c of the magnetic field 34 is converted into magnetic field components in the Y1 direction and the Y2 direction along the width directions of the magnetic sensor element 21a and the magnetic sensor element 21b. In this way, the z-component 34c of the magnetic field 34 which is generated from the magnet 33 acts on the magnetic sensor element 21a in the Y2 direction and acts on the magnetic sensor element 21b in the Y1 direction.

Further, as shown in FIG. 8B, a center position 23 (shown by a two-dot chain line 23 in FIG. 8B) in the width direction (the Y1-Y2 direction) of each of the magnetic sensor elements 21a and 21b is located further to the outside than the soft magnetic body 31. If so, since it is possible to increase a length protruding from a side surface 31b of the soft magnetic body 31, of each of the magnetic sensor elements 21a and 21b extending further in the Y1 direction and the Y2 direction than the side surfaces 31b of the soft magnetic body 31, the z-component 34c of the magnetic field 34 which is generated from the magnet 33 is reliably converted in the Y1-Y2 direction.

In this embodiment, the width dimension (the dimension in the Y1-Y2 direction) of each of the magnetic sensor elements 21a and 21b can be formed in a range of 5 μm to 15 μm, the width dimension of the soft magnetic body 31 can be formed in a range of 10 μm to 20 μm, and the height dimension of the soft magnetic body 31 can be formed in a range of 10 μm to 30 μm. Then, the center position 23 in the width direction of each of the magnetic sensor elements 21a and 21b is located on the outside 0.5 μm or more apart from the side surface 31b of the soft magnetic body 31. As shown in FIG. 9, the cross-sectional shape of the soft magnetic body 31 is a rectangular shape, and in order to efficiently converge the z-component 34c of the magnetic field 34 from the magnet 33, it is preferable to make the height dimension of the soft magnetic body 31 larger than the width dimension of the soft magnetic body 31.

As shown in FIG. 2 or 9, since the connecting portion 32 connecting the soft magnetic bodies 31 is provided, in a case where an impact or stress is applied at the time of manufacturing or the time of use, the connecting portion 32 fulfills a function to support the soft magnetic body 31, and thus even in a case where the height dimension of the soft magnetic body 31 is made large, it is possible to improve the shape stability of the soft magnetic body 31. Since the height dimension of the soft magnetic body 31 is high, the soft magnetic body 31 easily falls down during manufacturing, and by providing the connecting portion 32, it is possible to prevent the soft magnetic body 31 from falling down.

Further, as shown in FIG. 9, the respective magnetic sensor elements 21a to 21d and the soft magnetic bodies 31 are provided to extend in the X1-X2 direction, and due to the shape anisotropy of the respective magnetic sensor elements 21a to 21d and the soft magnetic bodies 31, the x-component 34a of the magnetic field 34 reliably acts on the respective magnetic sensor elements 21a to 21d in the X1-X2 direction.

Therefore, as shown in FIG. 9, the x-component 34a of the magnetic field 34 acts on the magnetic sensor element 21a in the X2 direction, and the z-component 34c of the magnetic field 34 is changed in magnetic path by the soft magnetic body 31, thereby acting on the magnetic sensor element 21a in the Y2 direction. The free magnetization direction 47a is directed along a direction in which the two magnetic field components are superimposed, and changes in a direction in which the angle between the fixed magnetization direction 45a and the free magnetization direction 47a becomes large. Since the z-component 34c of the magnetic field 34 is applied to the magnetic sensor element 21b in the Y1 direction, in contrast to the magnetic sensor element 21a, the free magnetization direction 47a changes in a direction in which the angle between the fixed magnetization direction 45a and the free magnetization direction 47a becomes small. On the magnetic sensor element 21c, the magnetic field 34 from the magnet 33 acts in the same manner as the magnetic sensor element 21a, and on the magnetic sensor element 21d, the magnetic field 34 from the magnet 33 acts in the same manner as the magnetic sensor element 21b. The rotation in an X-Z plane of the magnetic field 34 is related to the X-axis position of the magnet 33. Eventually, the rotation in the X-Z plane of the magnetic field 34 is converted to rotation on the GMR element (an X-Y plane). However, on the magnetic sensor element 21a and the magnetic sensor element 21b, the rotational directions are opposite directions.

Figure 10:
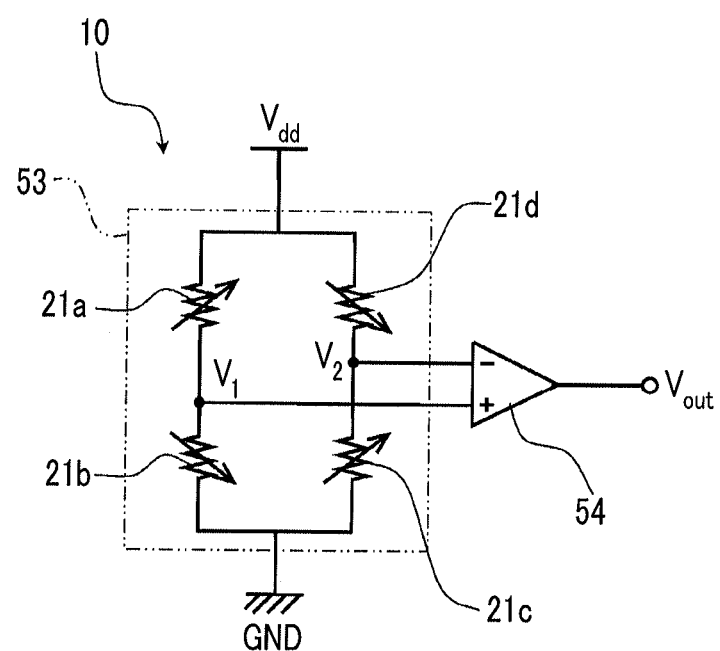
FIG. 10 is the full-bridge circuit when the magnet has moved in the X direction.

FIG. 10 is the full-bridge circuit when the magnet has moved in the X direction. In comparison with the initial state shown in FIGS. 6A, 6B, and 7, the resistance values of the magnetic sensor element 21a and the magnetic sensor element 21c are increased and the resistance values of the magnetic sensor element 21b and the magnetic sensor element 21d are reduced. Therefore, the midpoint voltage ($V_1$) between the magnetic sensor element 21a and the magnetic sensor element 21b is reduced, the midpoint voltage ($V_2$) between the magnetic sensor element 21c and the magnetic sensor element 21d is increased, and the difference ($V_1$–$V_2$) between the respective midpoint voltages is amplified by the differential amplifier 54 and output as the output voltage ($V_{out}$). It is possible to detect the position in the X direction of the magnet 33 by the output voltage ($V_{out}$).

In addition, in FIGS. 8A to 10, a case where the magnet 33 has moved in the X2 direction has been described. However, in a case where the magnet 33 has moved in the X1 direction, the z-component 34c of the magnetic field 34 acts in the opposite direction. Therefore, in the full-bridge circuit 53 shown in FIG. 10, the resistance values of the magnetic sensor element 21a and the magnetic sensor element 21c change in a direction to be reduced and the resistance values of the magnetic sensor element 21b and the magnetic sensor element 21d change in a direction to be increased. Therefore, similar to a case where the magnet 33 has moved in the X2 direction, also in a case where the magnet 33 has moved in the X1 direction, it is possible to detect the position in the X direction of the magnet 33 by the output voltage ($V_{out}$).

As described above, according to the magnetic sensor 10 of this embodiment, a magnetic path converting the magnetic field in the Z1-Z2 direction to the magnetic field in the Y1-Y2 direction is formed by providing the soft magnetic body 31. Therefore, the z-component 34c of the magnetic field 34 which is generated from the magnet 33 is branched into the z-component 34c which is directed in the Y1 direction and the z-component 34c which is directed in the Y2 direction and acts on each of the two magnetic sensor elements 21a and 21b in the Y1-Y2 direction. The two magnetic sensor elements 21a and 21b detect a magnetic field component in which the z-component 34c branched in the Y1-Y2 direction and the x-component 34a of the magnetic field 34 which is generated from the magnet 33 are superimposed, whereby it is possible to detect the position in the X1-X2 direction of the magnet 33. A GMR element which senses only a magnetic field component in a plane of a film becomes able to perform detection by converting a magnetic field in the Y1-Y2 direction in this manner.

That is, in the magnetic sensor 10 of this embodiment, the magnetic field 34 which is generated from the magnet 33 is converted from the X-Z plane to the X-Y plane, and thus it is possible to detect the position in the magnetization direction (the X1-X2 direction) of the magnet 33 by a magnetic field direction acting on each of the magnetic sensor elements 21a to 21d. Therefore, the y-component 34b of the magnetic field 34, which is generated from the magnet 33, does not act on the magnetic sensor elements 21a to 21d in relation to the position detection of the magnet 33, or the y-component 34b is offset by the full-bridge circuit 53.

Therefore, according to the magnetic sensor 10 of this embodiment, occurrence of an error due to the movement of the magnet 33 in a direction other than a detection direction is suppressed, and thus it is possible to accurately detect the position of the magnet 33.

Figure 11A:
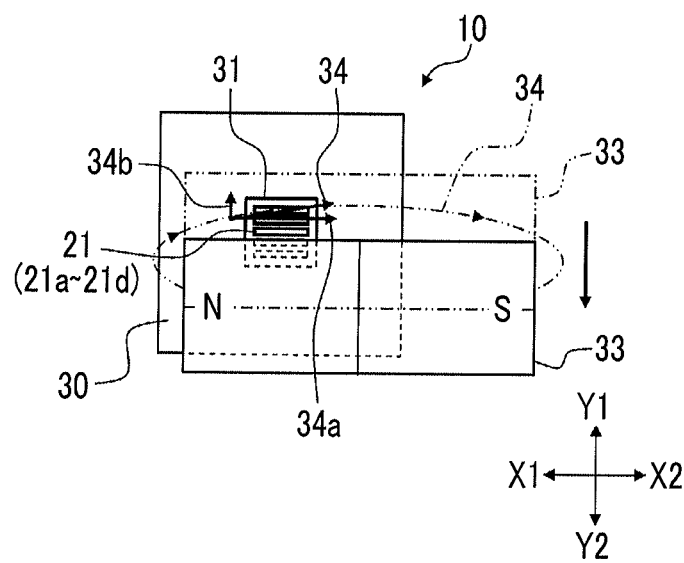
FIGS. 11A and 11B respectively are a plan view of the magnetic sensor and a plan view of the magnetic sensor element and the soft magnetic body showing the relationship between a magnetic field which is generated from the magnet and the direction of a magnetic field which acts on the magnetic sensor element, when the magnet has moved in a Y direction.
Figure 11B:
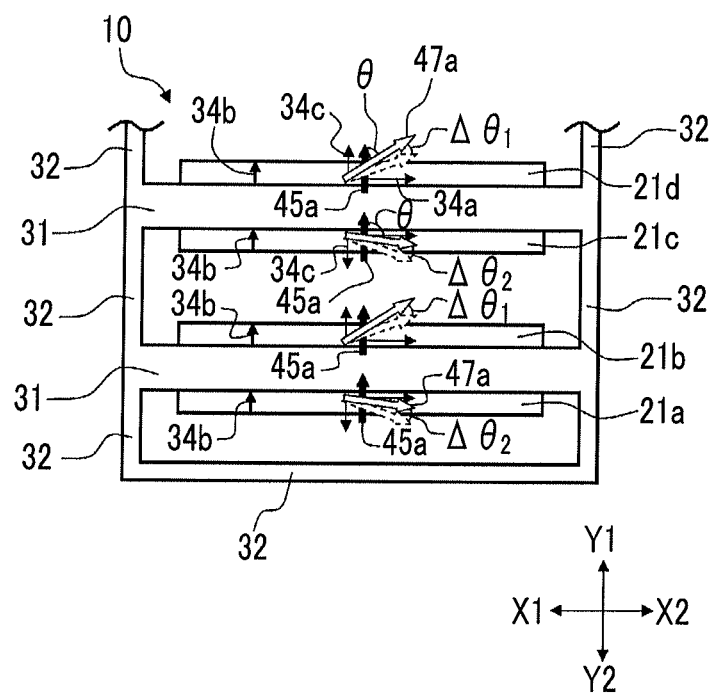

FIGS. 11A and 11B respectively are a plan view of the magnetic sensor and a plan view of the magnetic sensor element and the soft magnetic body showing the relationship between a magnetic field which is generated from the magnet and the direction of a magnetic field which acts on the magnetic sensor element, when the magnet has moved in the Y direction. In addition, the magnetic field 34 shown in FIG. 11A shows a direction of the magnetic field 34 projected on the X-Y plane. This is because in a plan view of FIG. 11A, at the position other than the center line of the magnet 33, the magnetic field 34 forms a symmetrical curve with respect to the center line.

In a case where the magnet 33 has moved in the X2 direction and moved in the Y2 direction, as shown in FIG. 11A, with the position where the center of the magnet 33 and the magnetic sensor element group 21 overlap, shown in FIG. 1B, as a standard, the magnetic field 34 crosses the magnetic sensor element group 21 in an oblique direction in a plan view, and thus the y-component 34b of the magnetic field 34 is generated. As shown in FIG. 11B, the y-component 34b acts on each of the magnetic sensor elements 21a to 21d in the Y1 direction. Further, the z-component 34c of the magnetic field 34 is generated due to the movement of the magnet 33 in the Y direction, and similar to the z-component 34c shown in FIG. 8B, the z-component 34c is converted in the Y1-Y2 direction and acts on each of the magnetic sensor elements 21a to 21d in the Y1 direction or the Y2 direction. In this embodiment, the fixed magnetization directions 45a of the plurality of magnetic sensor elements 21a to 21d are directed in the same direction and all of them are directed in the Y1 direction. Therefore, if the y-component 34b of the magnetic field 34 acts, all of the free magnetization directions 47a of the respective magnetic sensor elements 21a to 21d change in the same direction and in a direction in which the angle θ between the free magnetization direction 47a and the fixed magnetization direction 45a becomes small. Therefore, all of the resistance values of the respective magnetic sensor elements 21a to 21d decrease.

Then, in a case where all of the resistance values of the magnetic sensor element 21a and the magnetic sensor element 21b configuring the full-bridge circuit 53 shown in FIGS. 7 and 10 change so as to decrease, a change in the midpoint potential ($V_1$) is suppressed. Further, the resistance values of the magnetic sensor element 21c and the magnetic sensor element 21d also change likewise, and a change in the midpoint potential ($V_2$) is suppressed. Therefore, a change in the resistance of each of the magnetic sensor elements 21a to 21d is suppressed by the full-bridge circuit 53, and thus a change in the output voltage ($V_{out}$) is suppressed.

Therefore, even in a case where the magnet 33 moves in the Y direction and thus the y-component 34b of the magnetic field 34 acts on the magnetic sensor elements 21a to 21d, resistance changes of the respective magnetic sensor elements 21a to 21d are offset, and thus a change in the output voltage ($V_{out}$) is suppressed. Therefore, an error due to the movement of the magnet 33 in the Y direction is suppressed, and thus it is possible to accurately detect the position of the magnet 33.

Figure 12A:
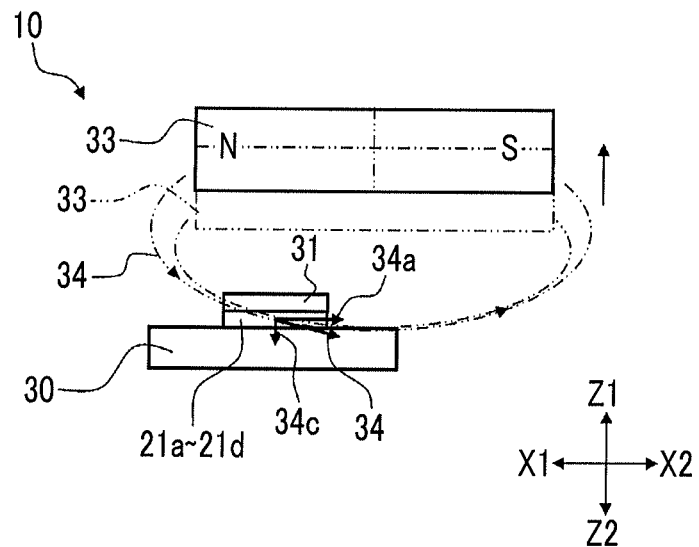
FIGS. 12A and 12B respectively are a side view showing the relationship between a magnetic field which is generated from the magnet and a magnetization direction of the free magnetic layer of the magnetic sensor element, when the magnet has moved in a Z direction, and a plan view of the magnetic sensor element and the soft magnetic body showing the relationship between a magnetic field which is generated from the magnet and a magnetization direction of the free magnetic layer of the magnetic sensor element, when the magnet has moved in a Z direction.
Figure 12B:
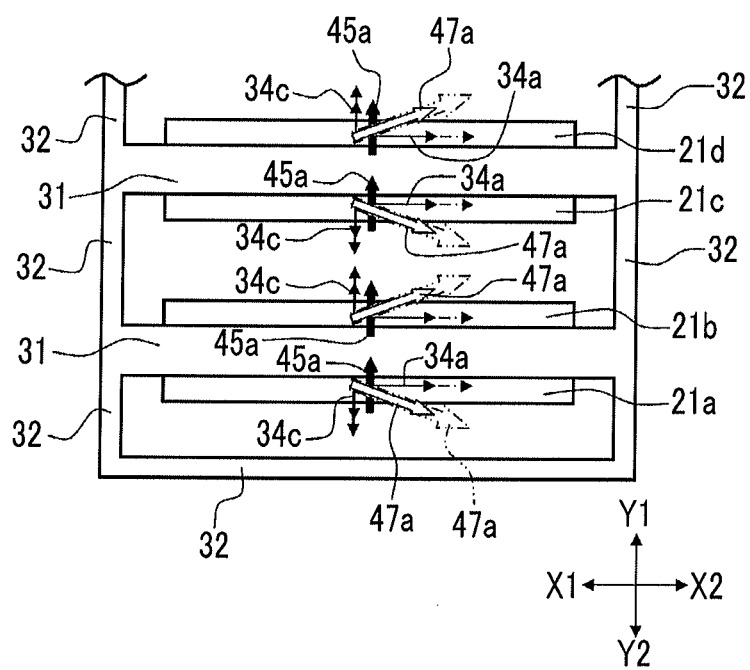

FIGS. 12A and 12B respectively are a side view and a plan view showing the relationship between a magnetic field which is generated from the magnet and a magnetization direction of the free magnetic layer of the magnetic sensor element, when the magnet has moved in the Z direction. In FIG. 12A, the position of the magnet 33 before the magnet 33 moves in the Z1 direction is shown by a two-dot chain line and the position of the magnet 33 when the magnet 33 has moved in the Z1 direction is shown by a solid line. Further, in FIG. 12B, a change in magnetic field strength in which the magnetic field 34 which is generated from the magnet 33 acts on each of the magnetic sensor elements 21a to 21d is schematically shown by the lengths of arrows indicating the x-component 34a and the z-component 34c.

As shown in FIG. 12A, the magnetic field 34 which is generated from the magnet 33 is incident on the soft magnetic bodies 31 and the magnetic sensor elements 21a to 21d in an oblique direction, and thus the x-component 34a and the z-component 34c of the magnetic field 34 are generated. The z-component 34c of the magnetic field 34 is converted in the Y1 direction and the Y2 direction, similar to the z-component 34c of the magnetic field 34 shown in FIG. 8B, and acts on the magnetic sensor elements 21a to 21d in the Y1 direction and the Y2 direction, as shown in FIG. 12B. As shown in FIG. 12B, when the magnet 33 has moved in the Z1 direction, the direction of the z-component 34c of the magnetic field 34 does not change, but, since the distance between the magnetic sensor elements 21a to 21d and the magnet 33 is increased, the magnetic field strength of the z-component 34c acting on the magnetic sensor elements 21a to 21d is reduced. Then, as shown in FIG. 12B, when the magnet 33 has moved in the Z1 direction, also with respect to the x-component 34a of the magnetic field 34, the magnetic field strength is reduced in the same manner.

As shown in FIG. 12B, in a case where the magnet 33 has moved in the Z1 direction, both the x-component 34a and the z-component 34c of the magnetic field 34 acting on each of the magnetic sensor elements 21a to 21d are reduced. For this reason, the strength of the magnetic field in which the x-component 34a and the z-component 34c of the magnetic field 34 are superimposed is reduced, but a change in direction is suppressed. Therefore, as shown in FIG. 12B, even in a case where the magnet 33 has moved in the Z1 direction, the free magnetization direction 47a of each of the magnetic sensor elements 21a to 21d is hardly changed.

In this embodiment, since the magnet 33 is provided such that the magnetic flux which is generated from the magnet 33 saturates the magnetization of the free magnetic layers 47 of the magnetic sensor elements 21a to 21d, the magnetization of the free magnetic layer 47 does not depend on magnetic field strength but depends on only a direction in which the magnetic field 34 from the magnet 33 acts on the magnetic sensor elements 21a to 21d. Therefore, even in a case where the magnet 33 has moved in the Z1 direction, magnetic field strength changes, but a change in the direction of the magnetic field 34 acting on the magnetic sensor elements 21a to 21d is small, and therefore, occurrence of an error in a case where the magnet 33 has moved in the Z1 direction is suppressed.

In addition, in FIGS. 12A and 12B, a case where the magnet 33 has moved in the Z1 direction is shown. However, even in a case where the magnet 33 has moved in the Z2 direction, similarly, the magnetic field strength acting on the magnetic sensor elements 21a to 21d is increased, but a direction does not change, similar to a case where the magnet 33 has moved in the Z1 direction. Therefore, occurrence of an error is suppressed. Further, in a case where the magnet 33 has moved in the Y1-Y2 direction, as shown in FIGS. 11A and 11B, the distance between the magnet 33 and the magnetic sensor elements 21a to 21d changes. Also in this case, the magnetic field strength of both the x-component 34a and the z-component 34c of the magnetic field 34 is reduced and the direction of the magnetic field in which the x-component 34a and the z-component 34c are superimposed does not change, and therefore, occurrence of an error is suppressed.

As described above, according to the magnetic sensor 10 of this embodiment, the magnetic field 34 which is generated from the magnet 33 is converted from the X-Z plane to the X-Y plane, and thus it is possible to detect the position in the magnetization direction (the X1-X2 direction) of the magnet 33 by the direction of the magnetic field acting on each of the magnetic sensor elements 21a to 21d. That is, since the y-component 34b of the magnetic field 34 is not used for position detection, it is possible to suppress occurrence of an error by offsetting the y-component 34b by the full-bridge circuit 53. Further, a position is detected by the direction of the magnetic field acting on each of the magnetic sensor elements 21a to 21d, and therefore, even in a case where the magnet 33 moves in the Z1-Z2 direction, whereby the distance between the magnet 33 and each of the magnetic sensor elements 21a to 21d changes, an error due to a change in magnetic field strength is suppressed. Therefore, occurrence of an error due to the movement of the magnet 33 in the Y1-Y2 direction and the Z1-Z2 direction which are directions other than the magnetization direction (the X1-X2 direction) is suppressed, and thus it is possible to accurately detect the position of the magnet 33 in the magnetization direction.

Further, according to the magnetic sensor 10 of this embodiment, since the z-component 34c of the magnetic field 34 which is generated from the magnet 33 is converted in the Y1-Y2 direction and thus the position in the X1-X2 direction of the magnet 33 is detected, the detection of the y-component 34b of the magnetic field 34 which is generated from the magnet 33 is suppressed. For this reason, a limitation such as disposing the magnetic sensor element group 21 having the plurality of magnetic sensor elements 21a to 21d so as to be shifted with respect to the magnet 33 when viewed from the Z1-Z2 direction is small, and thus it is possible to improve the degree of freedom of a design. Therefore, as shown in FIG. 1B, even if the magnetic sensor element group 21 is provided at a position overlapping with the center of the magnet 33, it is possible to accurately detect the position of the magnet 33 and it is possible to attain a reduction in the size of the magnetic sensor 10.

Figure 13:
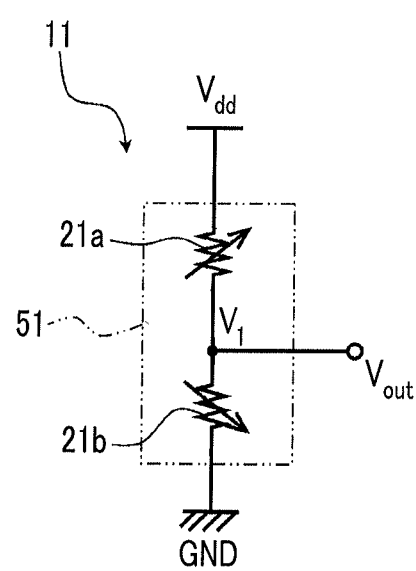
FIG. 13 is a half-bridge circuit configuring a magnetic sensor of a first modified example of this embodiment.

In this embodiment, as shown in FIGS. 7 and 10, the full-bridge circuit 53 is configured with the four magnetic sensor elements 21a to 21d. However, it is not limited thereto. FIG. 13 is a half-bridge circuit in a magnetic sensor according to a first modified example of this embodiment. As shown in FIG. 13, it is also possible to configure a half-bridge circuit 51 in which two magnetic sensor elements 21a and 21b are electrically connected in series between the input terminal ($V_{dd}$) and the ground terminal (GHD), and to make the midpoint potential ($V_1$) be the output voltage ($V_{out}$) of the magnetic sensor 10. In this manner, by configuring the half-bridge circuit 51 by at least two magnetic sensor elements 21a and 21b, it is possible to suppress occurrence of an error and accurately detect the position in the X direction of the magnet 33 with a simple circuit configuration, similar to the method shown in FIGS. 6A to 12B. Further, it is also possible to configure a bridge circuit by using four or more magnetic sensor elements.

Figure 14:
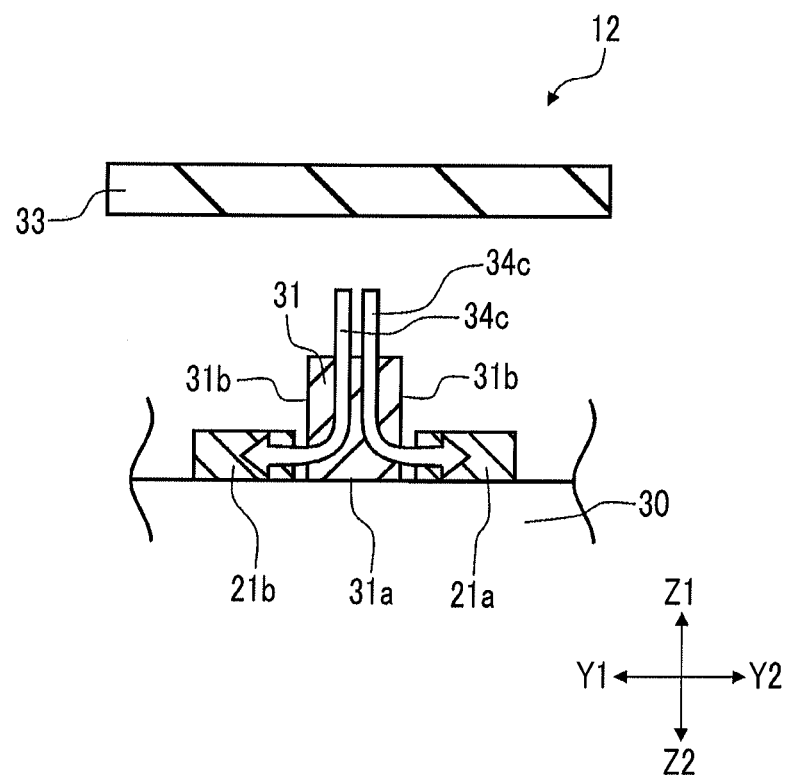
FIG. 14 is a partially enlarged cross-sectional view of a magnetic sensor in a second modified example of this embodiment.

FIG. 14 is a partially enlarged cross-sectional view of a magnetic sensor in a second modified example of this embodiment. In a magnetic sensor 12 of the second modified example, the disposition of the soft magnetic body 31 is different and the soft magnetic body 31 is not disposed so as to overlap with a portion of each of the magnetic sensor elements 21a and 21b. As shown in FIG. 14, in the magnetic sensor 12 of the second modified example, the soft magnetic body 31 is formed on the same surface as the surface of a base material 30, on which the magnetic sensor elements 21a and 21b are provided, and is disposed between the magnetic sensor elements 21a and 21b in the Y1-Y2 direction. Further, the height of the soft magnetic body 31 is formed to be higher than the heights of the magnetic sensor elements 21a and 21b.

Even in such an aspect, magnetic paths are formed by the soft magnetic body 31 and the magnetic sensor element 21a and by the soft magnetic body 31 and the magnetic sensor element 21b. In this modified example, the z-component 34c of the magnetic field 34, which is generated from the magnet 33, is converged to the soft magnetic body 31 and the magnetic paths are converted in the Y1 direction and the Y2 direction toward the respective magnetic sensor elements 21a and 21b from lower portions of the side surfaces 31b. In this way, the z-component 34c of the magnetic field 34, which is generated from the magnet 33, is converted in the Y1 direction and the Y2 direction, whereby occurrence of an error is suppressed, and thus it is possible to accurately detect the position in the X1-X2 direction of the magnet 33.

In this embodiment, as described above, each of the magnetic sensor elements 21a to 21d was set to be a giant magneto resistive effect (GMR) element. However, it is also possible to use a tunnel magneto resistive effect (TMR) element. Further, the shape of the magnet 33 is not particularly limited and the same effects are exhibited even in various shapes such as a rod shape, a flat plate shape, a circular shape, and an irregular shape.

It should be understood by those skilled in the art that various modifications, combinations, sub-combinations and alterations may occur depending on design requirements and other factors insofar as they are within the scope of the appended claims of the equivalents thereof.

What is claimed is:

1. A magnetic sensor for detecting a position or movements of a magnet in a first direction, comprising:
   a magnet magnetized in the first direction, the magnet generates a magnetic field component in the first direction;
   two parallel magnetic sensor elements, wherein the two parallel magnetic sensor elements extend in the first direction,
   wherein the two parallel magnetic sensor elements are spaced apart from each other in a second direction orthogonal to the first direction, the two parallel magnetic sensor elements facing the magnet in a third direction orthogonal to the first direction and the second direction, wherein the magnet being a separate piece from the two parallel magnetic sensor elements and the magnet being detachably movable in anyone of the first direction, the second direction and the third direction relative to the two parallel magnetic sensor elements;
   a soft magnetic body extending in the first direction and separately disposed between the magnet and the two parallel magnetic sensor elements in the third direction, wherein the soft magnetic body is located directly above and overlapping between the two magnetic sensor elements in the second direction, wherein a magnetic field component is generated in the third direction from the magnet due to the soft magnetic body,
   wherein the two parallel magnetic sensor elements each having a fixed magnetic layer in which magnetization is fixed, all of the magnetization directions of the fixed magnetic layers of the two parallel magnetic sensor elements are directed in the second direction, and a free magnetic layer in which magnetization changes due to an external magnetic field, and are provided in a range in which magnetic flux generated from the magnet saturates magnetization of the free magnetic layers of the two parallel magnetic sensor elements,
   wherein magnetization directions of the fixed magnetic layers of the two parallel magnetic sensor elements are the same as each other,
   wherein the magnetic field generated in the first direction and the magnetic field generated in the third direction are superimposed in a free magnetization direction, such that the two parallel magnetic sensor elements detect the position and movements of the magnet in the first direction while suppressing occurrence of errors caused by other movements of the magnet relative to the two parallel magnetic sensor elements in the second direction or the third direction; and
   a bridge circuit configured with the two parallel magnetic sensor elements for outputting a voltage to indicate the detected position or movements.

2. The magnetic sensor according to claim 1, wherein the soft magnetic body has end portions opposite to each other in the third direction, and
   the end portion which is located on the sides of the two parallel magnetic sensor elements is disposed to overlap with a portion of each of the two parallel magnetic sensor elements.

3. The magnetic sensor according to claim 2, wherein a center in a width direction of the magnetic sensor element is located further to the outside in the width direction than the soft magnetic body.

4. The magnetic sensor according to claim 1, further comprising: two other magnetic sensor elements parallel to the two parallel magnetic sensor elements, wherein a full-bridge circuit is configured with the four parallel magnetic sensor elements.

5. The magnetic sensor according to claim 1, wherein when viewed from the third direction, a sensor element group which includes the two parallel magnetic sensor elements is provided at a position overlapping with the center of the magnet.

* * * * *